(12) United States Patent
Kooriyama

(10) Patent No.: US 7,298,955 B2
(45) Date of Patent: Nov. 20, 2007

(54) SOLID-STATE IMAGE PICKUP ELEMENT AND METHOD OF PRODUCING THE SAME

(75) Inventor: Hideki Kooriyama, Miyagi (JP)

(73) Assignee: Fujifilm Corporation, Tokyo (JP)

( * ) Notice: Subject to any disclaimer, the term of this patent is extended or adjusted under 35 U.S.C. 154(b) by 0 days.

(21) Appl. No.: 11/391,541

(22) Filed: Mar. 29, 2006

(65) Prior Publication Data

US 2006/0220073 A1   Oct. 5, 2006

(30) Foreign Application Priority Data

Mar. 30, 2005   (JP)   ............................ P.2005-099765

(51) Int. Cl.
*G02B 6/10* (2006.01)
(52) U.S. Cl. .................................................. 385/146
(58) Field of Classification Search ................ 257/257, 257/258, 262, 290, 291, 292; 348/296, 300, 348/301, 307, 308; 385/146
See application file for complete search history.

(56) References Cited

FOREIGN PATENT DOCUMENTS

| JP | 7-45805 A | 2/1995 |
|---|---|---|
| JP | 2002-118245 A | 4/2002 |

OTHER PUBLICATIONS

Raw Machine-Language Translation of JP 2002118245A , Feb. 1, 2007.*

* cited by examiner

*Primary Examiner*—Quyen P Leung
(74) *Attorney, Agent, or Firm*—Birch, Stewart, Kolasch & Birch, LLP

(57) ABSTRACT

A solid-state image pickup element comprises: a semiconductor substrate; a photoelectric converting portion formed in the semiconductor substrate; a reflective material portion comprising a hole portion wherein the hole portion is located on a surface, on an area in which the photoelectric converting portion is formed, of the semiconductor substrate, the reflective material portion being formed so as to cover a surface of the semiconductor substrate; and an optical waveguide that propagates incident light while confining the light, to guide the light to the photoelectric converting portion, wherein the optical waveguide is configured by a transparent film formed in the hole portion, the transparent film having a light guiding function.

19 Claims, 15 Drawing Sheets

PRIOR ART FIG. 12A
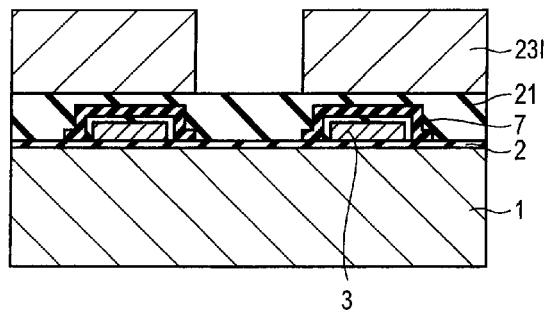
PRIOR ART FIG. 12B
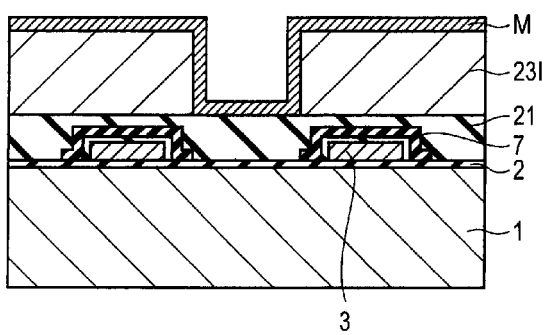
PRIOR ART FIG. 12C
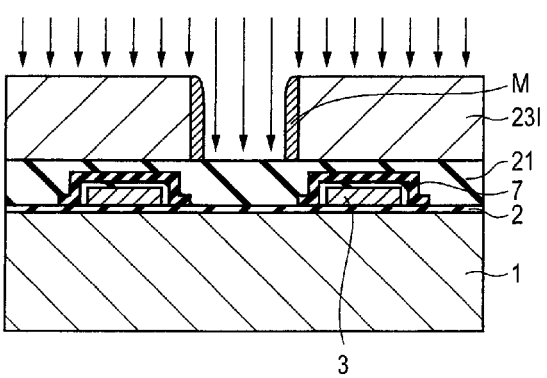

PRIOR ART  FIG. 13A
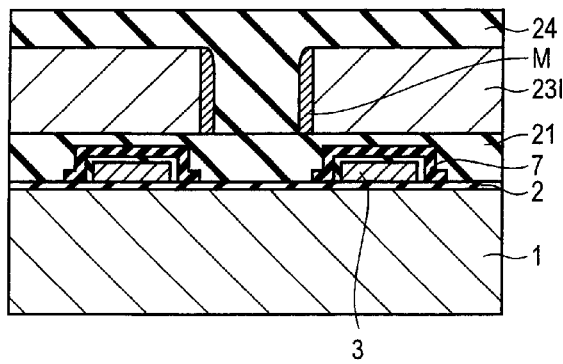
PRIOR ART  FIG. 13B
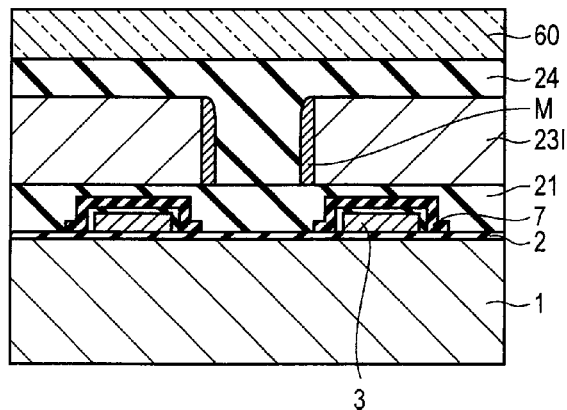
PRIOR ART  FIG. 13C
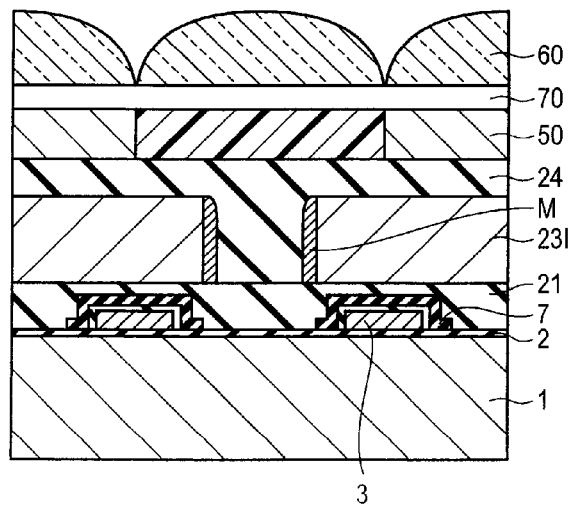

PRIOR ART  FIG. 14A
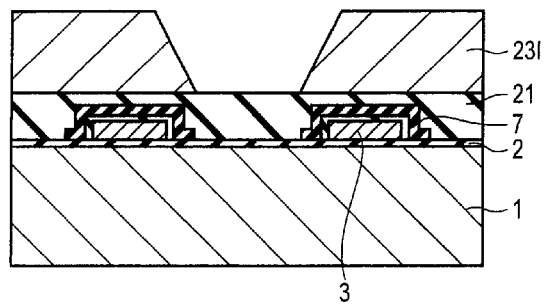
PRIOR ART  FIG. 14B
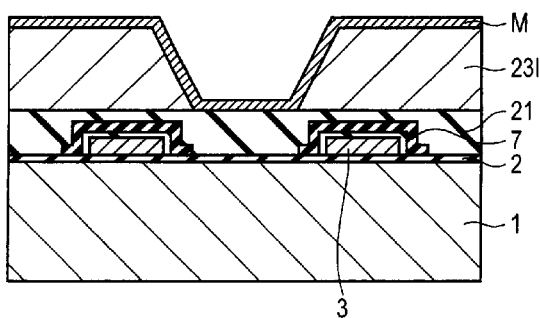
PRIOR ART  FIG. 14C
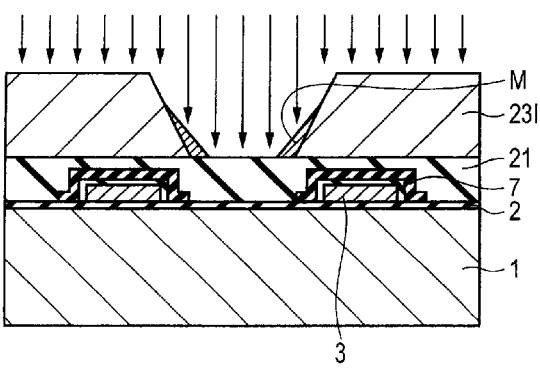

PRIOR ART  FIG. 15A
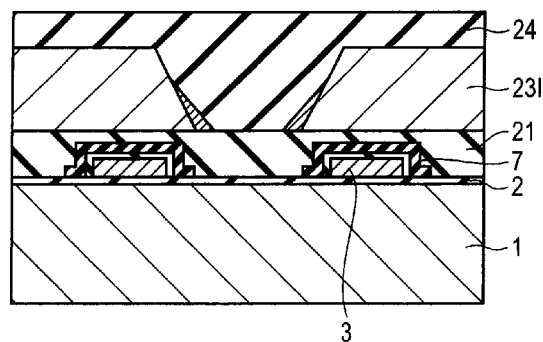
PRIOR ART  FIG. 15B
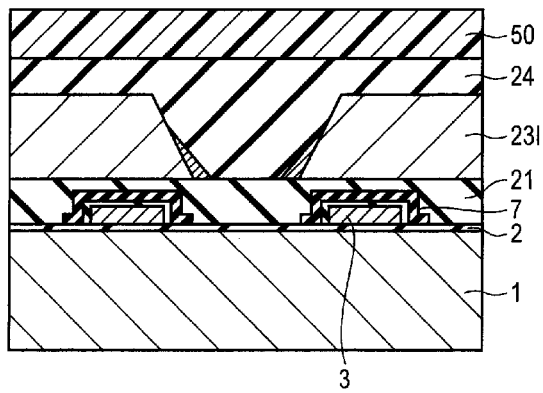
PRIOR ART  FIG. 15C
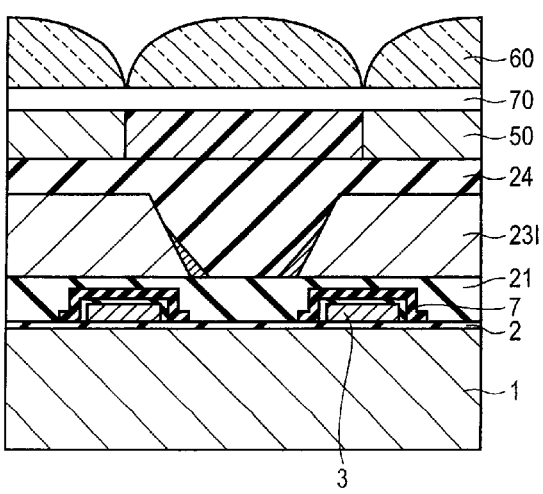

SOLID-STATE IMAGE PICKUP ELEMENT AND METHOD OF PRODUCING THE SAME

BACKGROUND OF THE INVENTION

1. Field of the Invention

The present invention relates to a solid-state image pickup element and a method of producing it, and more particularly to an improvement in characteristics of a solid-state image pickup element having a microstructure.

2. Description of the Related Art

A solid-state image pickup element using a CCD which is an imaging device such as an area sensor has a basic structure having: a photoelectric converting portion such as a photodiode; a portion for reading a charge from the photoelectric converting portion; and a charge transferring portion comprising charge transfer electrodes for transferring the read charge. The charge transfer electrodes are adjacently arranged on a charge transfer channel formed in the surface of a semiconductor substrate, and sequentially driven by a clock signal.

Recently, in solid-state image pickup elements, the number of imaging pixels is increased, and hence miniaturization of the pixels is advancing. In accordance with this, also miniaturization of a photoelectric converting portion is advancing. Therefore, it is difficult to maintain a high sensitivity.

To comply with this situation, various methods of efficiently converging light which reaches the vicinity of an opening to a photoelectric converting portion have been proposed.

For example, a technique has been disclosed in which a hole portion is formed in a planarizing layer in a position immediately above a light receiving portion, the hole portion is then filled with a high-refractive index material to form an optical waveguide, and light is totally reflected by an interface between the high-refractive index film serving as the optical waveguide and the planarizing layer, whereby light is introduced into the light receiving portion. Furthermore, a structure has been proposed in which, in a solid-state image pickup element having: a light receiving portion formed in a substrate; an optical waveguide that confines and propagates incident light within an interlayer film formed on the substrate, to guide the light to the light receiving portion, and a gap is formed between the optical waveguide and the interlayer film, thereby further enhancing the light guiding function.

As an example of a solid-state image pickup element having such an optical waveguide structure, in order to further enhance the light converging property, a structure has been proposed in which, as shown in FIG. 10, an insulating layer 23I made of silicon oxide or the like in a photodiode is etched to form a hole for an optical waveguide, and a reflection film M configured by a thin metal film is formed on the sidewall of the hole (JP-A-7-45805). The hole is filled with a transparent material such as a silicon oxide film to form an optical waveguide.

In the solid-state image pickup element, the optical waveguide is formed on the surface of a semiconductor substrate in which a photodiode (photoelectric converting portion) 30 and a charge transferring portion 40 are formed, and the reflection film M configured by a thin metal film is formed on the sidewall of the optical waveguide.

In this structure, the opening of the optical waveguide is narrow, and therefore it is difficult to guide obliquely incident light to the photodiode.

Therefore, a structure has been proposed in which, in a solid-state image pickup element, an opening of an optical waveguide is configured by a tapered face to be widened as shown in FIG. 11 in order to efficiently guide incident light to a light receiving portion without lowering the sensitivity of the light receiving portion, and with reducing influences due to positional displacement or optical path misalignment at a small F value or the like (JP-A-2002-118245).

In this structure, the opening of the optical waveguide is widened. In the case where the tapered face is formed in an opening portion, however, also the inclined side face is etched away when anisotropic etching is performed so that the reflection film M is selectively left on the tapered face. Therefore, it is difficult to form the thin metal film on the tapered face with high controllability.

FIGS. 12A to 12C and 13A to 13C are diagrams showing steps of producing the solid-state image pickup element shown in FIG. 10, and FIGS. 14A to 14C and 15A to 15C are diagrams showing steps of producing the solid-state image pickup element shown in FIG. 11. The steps correspond to those of Embodiment 1 which will be described later, respectively.

As described above, in the case of JP-A-7-45805 (FIG. 10) in which the side face of the optical waveguide is perpendicular to the surface of the substrate, the opening of the optical waveguide is narrow, and it is difficult to guide obliquely incident light to the photodiode. Therefore, there is a problem in that a sufficient light converging efficiency cannot be obtained. In the case of the structure of JP-A-2002-118245 (FIG. 11) in which the tapered face is formed in the opening portion, the opening of the optical waveguide can be widened, but also the inclined side face is etched away when anisotropic etching is performed so that the reflection film M is selectively left on the tapered face. Therefore, it is difficult to form a thin metal film with high controllability.

Moreover, oblique light cannot be sufficiently converged, and the photoelectric conversion efficiency may be lowered. Light from an adjacent pixel may enter to cause color mixture.

SUMMARY OF THE INVENTION

The invention has been conducted in view of the above-discussed circumstances. It is an object of the invention to provide a solid-state image pickup element in which, even when miniaturization is performed, the light converging efficiency can be further improved, oblique light can be efficiently converged, and the optical characteristics are excellent.

It is another object of the invention to provide a method of producing a solid-state image pickup element which can be easily produced, and which is highly reliable.

According to the invention, there is provided a solid-state image pickup element comprising: (i) a semiconductor substrate; (ii) an image section formed in the semiconductor substrate, the image section comprising: a photoelectric converting portion; and a charge transferring portion that transfers a charge produced in the photoelectric converting portion; (iii) a peripheral circuit section that processes an output of the charge transferring portion; (iv) a reflective material portion comprising a hole portion wherein the hole portion is located on a surface, on an area in which the photoelectric converting portion is formed, of the semiconductor substrate, the reflective material portion being formed so as to cover a surface of the semiconductor substrate; and (v) an optical waveguide that propagates incident light while confining the light, to guide the light to the photoelectric converting portion, wherein the optical waveguide is configured by a transparent film formed in the hole portion, the transparent film having a light guiding function.

According to the configuration, the region surrounding the optical waveguide is configured by a light blocking material layer. Therefore, obliquely incident light can be surely blocked, uneven light receiving caused by defocusing due to positional misalignment of a microlens can be eliminated, and light can be efficiently converged. Since the whole wall surrounding the optical waveguide is configured by a reflective material instead of a reflection film, light is surely prevented from entering an adjacent pixel, whereby color mixture can be prevented from occurring. A reliable light converging structure can be formed without increasing the number of production steps.

In the solid-state image pickup element of the invention, the reflective material portion in which the hole portion configures a tapered face opened toward an upper portion of the semiconductor substrate is formed so as to cover a whole surface of the imaging section excluding the hole portion of the photoelectric converting portion.

According to the configuration, the hole portion configures the tapered face that is opened toward an upper portion of the semiconductor substrate. Therefore, oblique light can be guided, and the light converging property can be further improved.

In the solid-state image pickup element of the invention, the reflective material portion is configured by an electrically conductive material, and the solid-state image element further comprises a wiring portion in the peripheral circuit section, the wiring portion being configured by the electrically conductive material.

According to the configuration, the optical waveguide of a pixel portion, and the wiring material of the peripheral circuit section are identical with each other. Therefore, they can be simultaneously formed in the same step, and the number of production steps can be reduced.

In the solid-state image pickup element of the invention, the electrically conductive material is a material containing at least one of aluminum, silver, gold and tungsten.

In the solid-state image pickup element of the invention, in the peripheral circuit section, the transparent film of the optical waveguide configures a passivation film that covers the wiring portion.

According to the configuration, in the peripheral circuit section, the transparent film configuring the optical waveguide configures the passivation film which covers the wiring portion. Therefore, they can be simultaneously formed in the same step, and the number of production steps can be reduced.

In the solid-state image pickup element of the invention, the peripheral circuit section comprises a wiring portion formed at a level which is higher than the reflective material portion.

According to the configuration, a conductor layer is formed in a subsequent step. Even when a plasma process is used in steps such as film forming or etching, therefore, plasma damage due to the antenna effect does not occur.

In the solid-state image pickup element of the invention, a planarizing layer covering the reflective material portion, the planarizing layer configuring a passivation film for the wiring portion of the electrically conductive material.

According to the configuration, also the planarizing layer and the passivation film can be simultaneously formed in the same step, and the number of production steps can be reduced.

In the solid-state image pickup element of the invention, the reflective material portion of an insulative material configures a passivation film covering the wiring portion in the peripheral circuit section.

According to the configuration, the reflective material portion, and the passivation film which covers the wiring portion can be formed in the same step, and the number of production steps can be reduced.

In the solid-state image pickup element of the invention, the transparent film is a stacked film of: a silicon nitride film; and a silicon oxide film or an organic film.

According to the configuration, the light converging efficiency can be further enhanced.

According to the invention, there is provided

A method of producing a solid-state image pickup element which comprises: (i) a semiconductor substrate; (ii) imaging section formed in the semiconductor substrate, the image section comprising: a photoelectric converting portion; and a charge transferring portion that transfers a charge produced in the photoelectric converting portion; (iii) a peripheral circuit section that processes an output of the charge transferring portion; and (iV) an optical waveguide that propagates incident light while confining the light, to guide the light to the photoelectric converting portion, the method comprising: a step of forming the optical waveguide including: forming a reflective material film so as to cover a surface of the semiconductor substrate in which the imaging section is formed; forming, in the reflective material film, a hole portion in a region corresponding to the photoelectric converting portion; and forming a transparent film in the hole portion, the transparent film having a predetermined refractive index to have a light guiding function.

According to the configuration, the reflective material film is not formed on the inner wall of the hole portion, but the whole wall is configured by the reflective material film. Therefore, it is possible to provide a solid-state image pickup element in which the number of production steps can be reduced, and which can attain a high light converging efficiency.

In the method of producing a solid-state image pickup element of the invention, the step of forming the hole portion is a step in which etching is performed on the reflective material film while controlling etching conditions so as to form a predetermined tapered face.

According to the configuration, it is possible to perform the control so as to easily obtain an accurate shape.

In the method of producing a solid-state image pickup element of the invention, the step of forming the optical waveguide includes the steps: forming an electrically conductive material film over a whole surface of the semiconductor substrate; patterning the electrically conductive material so as to form, in the imaging section, the hole portion corresponding to the photoelectric converting portion and so as to form, in the peripheral circuit section, a wiring portion.

According to the method, the wall of the electrically conductive material film serving as the reflective material surrounding the optical waveguide, and the wiring portion can be formed in the same step, and the surface can be planarized. Furthermore, the number of production steps can be reduced.

In the method of producing a solid-state image pickup element of the invention, the electrically conductive material is a material containing at least one of aluminum, silver, gold and tungsten.

In the method of producing a solid-state image pickup element of the invention, the method further includes a step of, after the step of patterning the electrically conductive material film, forming the transparent film so as to cover the hole portion and the wiring portion of the peripheral circuit section, and, in the imaging section, the transparent film configures the optical waveguide, and, in the peripheral circuit section, configures a passivation film which covers the wiring portion.

According to the method, the transparent film configuring the optical waveguide, and the passivation film of the peripheral circuit section can be formed in the same step, and the surface can be planarized. Furthermore, the number of production steps can be reduced.

In the method of producing a solid-state image pickup element of the invention, a step of forming the wiring portion of the peripheral circuit section is executed after the step of forming the reflective material portion.

According to the method, after the step of forming the reflective material portion, the wiring portion of the peripheral circuit section is formed. Consequently, the degree of freedom of selection of the material is enhanced, and the wiring portion of the peripheral circuit is formed in a position near the uppermost layer. Even when a plasma process is used in a subsequent step, therefore, plasma charging due to the antenna effect can be reduced.

In the method of producing a solid-state image pickup element of the invention, the method further include a step of forming a planarizing layer which covers the reflective material portion, which is a step of simultaneously forming the planarizing layer and a passivation film which covers the wiring portion of the electrically conductive material.

According to the method, the planarizing layer which covers the reflective material portion, the passivation film can be formed in the same step, and the surface can be planarized. Furthermore, the number of production steps can be reduced.

In the method of producing a solid-state image pickup element of the invention, the step of forming the reflective material portion includes a step of forming a film of an insulative material over a whole surface of the semiconductor substrate, which is a step of configuring a passivation film which covers a wiring portion in the peripheral circuit section.

According to the method, the reflective material portion and the passivation film can be formed in the same step, and the surface can be planarized. Furthermore, the number of production steps can be reduced.

BRIEF DESCRIPTION OF THE DRAWINGS

FIGS. 12A to 12C are section views of steps of producing the solid-state image pickup element of the related-art example;

FIGS. 13A to 13C are section views of steps of producing the solid-state image pickup element of the related-art example;

FIGS. 14A to 14C are section views of steps of producing the solid-state image pickup element of the other related-art example; and FIGS. 15A to 15C are section views of steps of producing the solid-state image pickup element of the other related-art example.

DETAILED DESCRIPTION OF THE INVENTION

Next, embodiments of the invention will be described in detail with reference to the accompanying drawings.

EMBODIMENT 1

Figure 1:
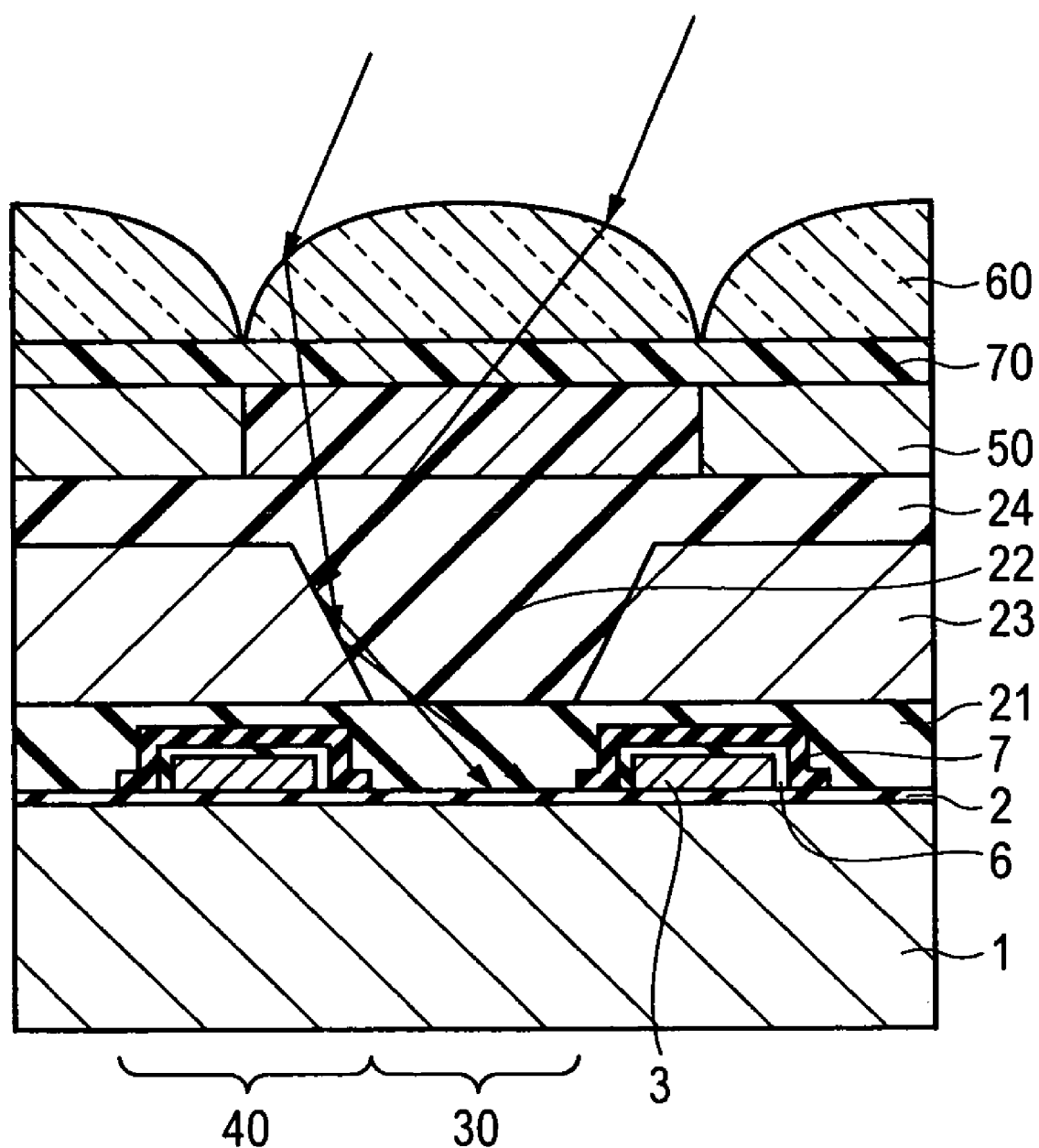
FIG. 1 is a section diagram of a solid-state image pickup element of Embodiment 1 of the invention.
Figure 2:
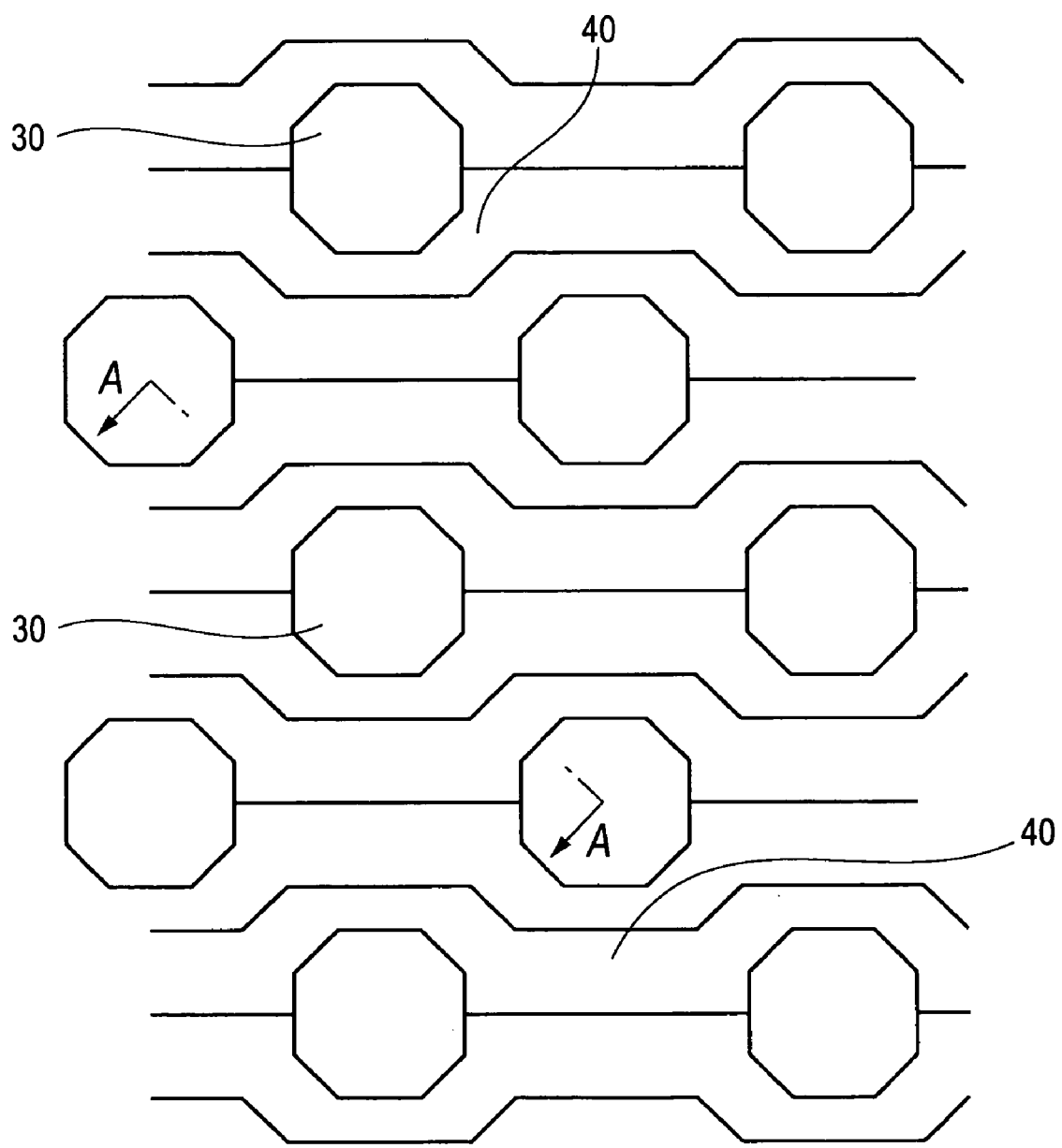
FIG. 2 is a plan view of the solid-state image pickup element of Embodiment 1 of the invention.

FIG. 1 is a section view showing a main portion of a solid-state image pickup element, and FIG. 2 is a plan view of a main portion of an imaging region. FIG. 1 is a section view taken along the line A-A of FIG. 2. The solid-state image pickup element is characterized in that an optical waveguide 22 formed above a photodiode 30 serving as a photoelectric converting portion is formed in a reflective material film 23 which covers the surface of a semiconductor substrate, and which has a hole portion on the photodiode 30. The hole portion configures a tapered face that is opened toward an upper portion of the semiconductor substrate, so as to further enhance the light converging property. The reflective material film 23 is configured by a single-layer film of aluminum.

The reflective material film 23 configured by the aluminum film in which an opening is formed in a region corresponding to the photodiode 30 is disposed above an imaging section of the solid-state image pickup element. On the film, a planarizing layer 24 serving also as the waveguide 22, a color filter 50, a planarizing layer 70, and a microlens 60 are sequentially stacked via a planarizing layer 21 formed by a BPSG film. The planarizing layer 24 is configured by a cover film made of a silicon nitride film, and an organic resin film.

As shown in FIG. 1, the solid-state image pickup element comprises: the photodiode 30 which is formed on a silicon substrate 1, and which has a pn junction (not shown); and a charge transferring portion 40 which has a charge transfer electrode 3 formed on a gate oxide film 2, and which transfers a charge produced in the photodiode 30.

In the imaging section of the solid-state image pickup element, as shown in the schematic plan view of FIG. 2, plural photodiodes 30, and charge transferring portions 40 which transfer charges detected from the photodiodes 30 are formed on the semiconductor substrate so as to meander between the photodiodes 30. Although not shown in FIG. 2, charge transfer channels through which signal charges transferred by the charge transferring portions 40 are moved are formed similarly in a meandering form in a direction crossing the direction along which the charge transferring portions 40 elongate.

A p-well is formed in the silicon substrate 1. A photodiode is formed by an n-type impurity region which cooperates with the p-well to form a pn junction, and a heavily doped p-type impurity region which is formed on the surface of the n-type impurity region, and which functions as a surface potential adjusting layer. This structure will be described in detail in the description of Embodiment 2.

An antireflection film 6 made of a silicon nitride film having a thickness of 30 nm is formed on the charge transfer electrode 3 via a silicon oxide film (not shown). On the film, a thin tungsten film which functions as a light blocking layer 7, which has an opening in a light receiving region of the photodiode 30, and which has a thickness of 200 nm is formed via a titan nitride layer (not shown) which is formed by the sputtering method, and which has a thickness of 50 nm. The tungsten film is covered by a silicon nitride film (not shown) functioning as an antireflection film, and the planarizing layer 21 formed by a BPSG film. The optical waveguide in the upper layer is as described above.

The reflective material film 23 is an aluminum film which is patterned so that a hole portion having a tapered side face is formed, on the photodiode 30. The planarizing layer 24 is formed on the surface including the hole portion, via a cover film (not shown) which is made of a silicon nitride film formed by the CVD method, so that a transparent film configure the waveguide 22 in the hole portion. The other regions are formed in the same manner as those of the usual solid-state image pickup element.

Next, steps of producing the solid-state image pickup element will be described briefly.

Although description is omitted, the photodiode and the charge transferring portion are formed in the usual method.

Figure 3A:
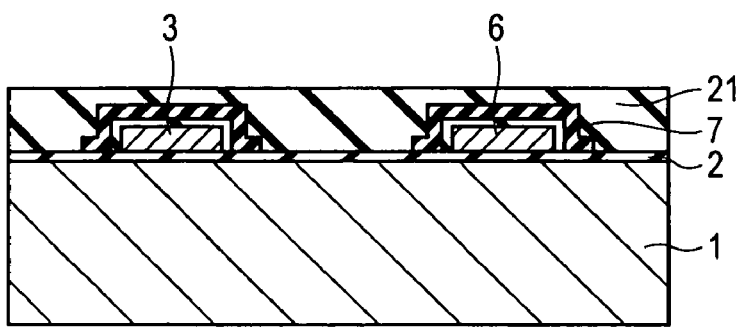
FIGS. 3A to 3C are section views showing steps showing producing the solid-state image pickup element of Embodiment 1 of the invention.

As shown in FIG. 3A, a silicon oxide film is formed by the low-temperature CVD method on the surface of the substrate 1 on which the photodiode and the charge transfer electrode are formed, and the planarizing layer 21 is formed by the CMP.

Figure 3B:
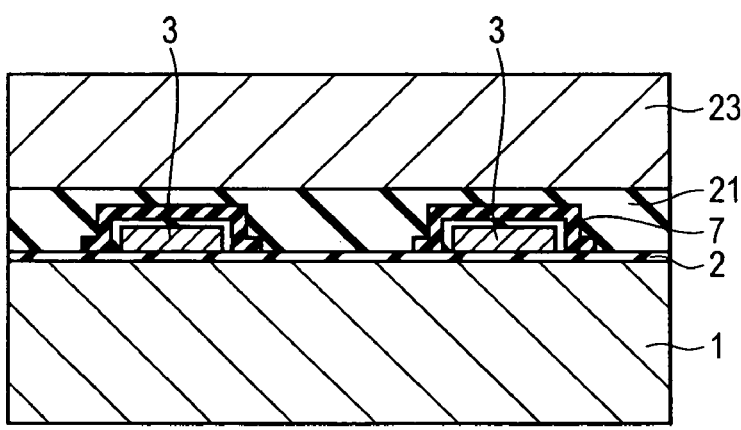

As shown in FIG. 3B, an aluminum layer having a thickness of 500 to 1,000 nm is formed as the reflective material film 23 by the sputtering method on the planarizing layer.

Figure 3C:
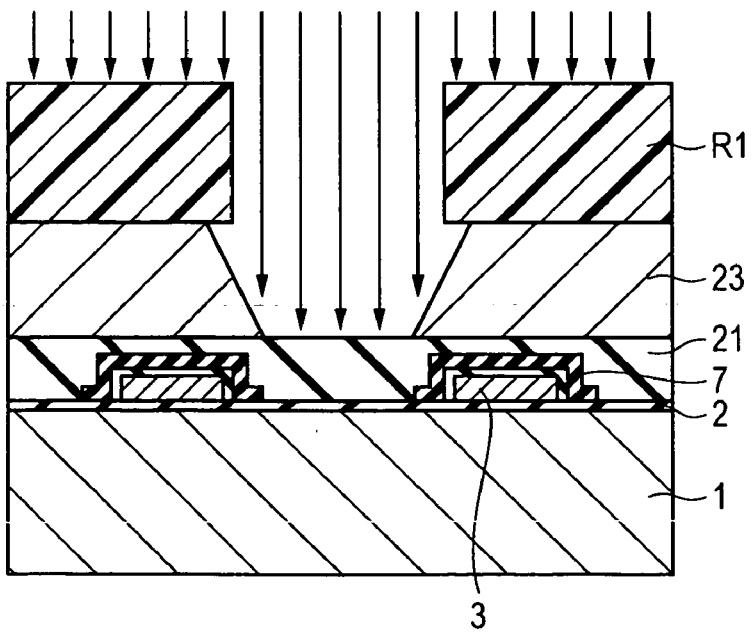

As shown in FIG. 3C, a resist pattern R1 is formed on the reflective material film by performing a patterning process using the photolithography technique, anisotropic etching (RIE) is performed with using the resist pattern as a mask to form deposition on the sidewall, and the reflective material film 23 is patterned under conditions in which a tapered section is formed, thereby forming a hole portion.

Figure 4A:
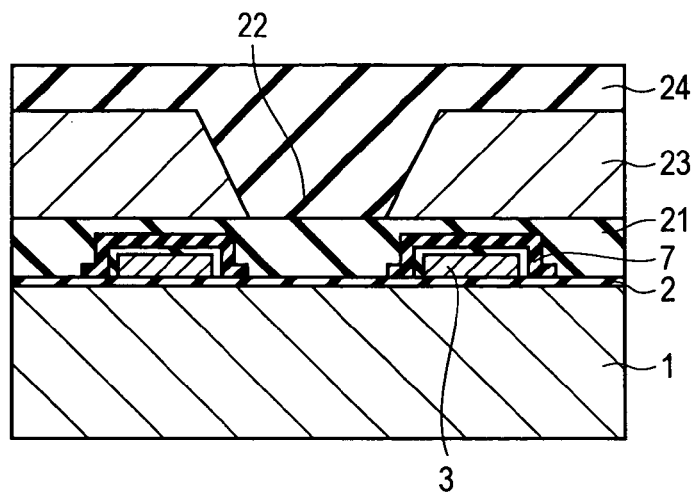
FIGS. 4A to 4C are section views showing steps showing producing the solid-state image pickup element of Embodiment 1 of the invention.

Thereafter, as shown in FIG. 4A, the planarizing layer 24 functioning also as the optical waveguide 22 is formed. The planarizing layer 24 is formed by a cover film made of a silicon nitride film, and an organic film.

Figure 4B:
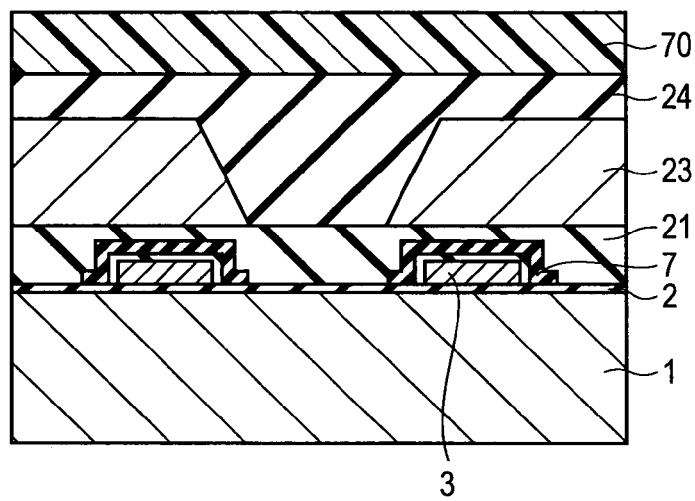

As shown in FIG. 4B, the color filter layer 50 is formed. In this case, a photolithography process is performed so that color filters of the three colors or R, G, and B are sequentially juxtaposed.

Figure 4C:
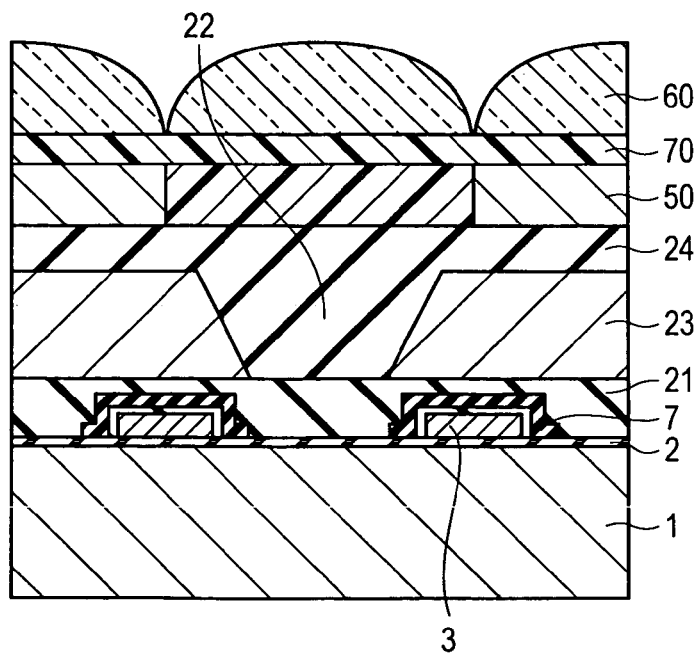

As shown in FIG. 4C, the planarizing layer 70 made of an organic film is formed by the application method, and thereafter the microlens 60 is formed.

In this way, the solid-state image pickup element is completed.

According to the embodiment, a reflective material film is not formed on the inner wall of the hole portion, but the whole wall is configured by the aluminum layer which is a reflective material film. Therefore, it is possible to provide a solid-state image pickup element in which the number of production steps can be reduced, and which can attain a high light converging efficiency. The etching process is performed while controlling etching conditions so as to form a predetermined tapered face, thereby enabling the formation of the tapered section to be controlled so as to easily obtain an accurate shape.

Since the whole wall is configured by the aluminum layer which is a reflective material film, light from an adjacent pixel is prevented from entering, whereby color mixture can be prevented from occurring.

The hole portion is provided so as to form a tapered section. Therefore, defocusing due to positional misalignment of the microlens 60 can be reduced, and oblique light can be efficiently converged and guided to the photodiode serving as the photoelectric converting portion. As a result, it is possible to form a solid-state image pickup element which is minute, and which has a high sensitivity.

The reflective material can be formed thick, and hence light can be surely converged.

Since the whole pixel area excluding the light receiving portion is covered by the reflective material, color mixture can be prevented from occurring.

In the description of the embodiment, in order to facilitate the description, the configuration is simplified.

EMBODIMENT 2

Next, Embodiment 2 of the invention will be described.

Figure 5:
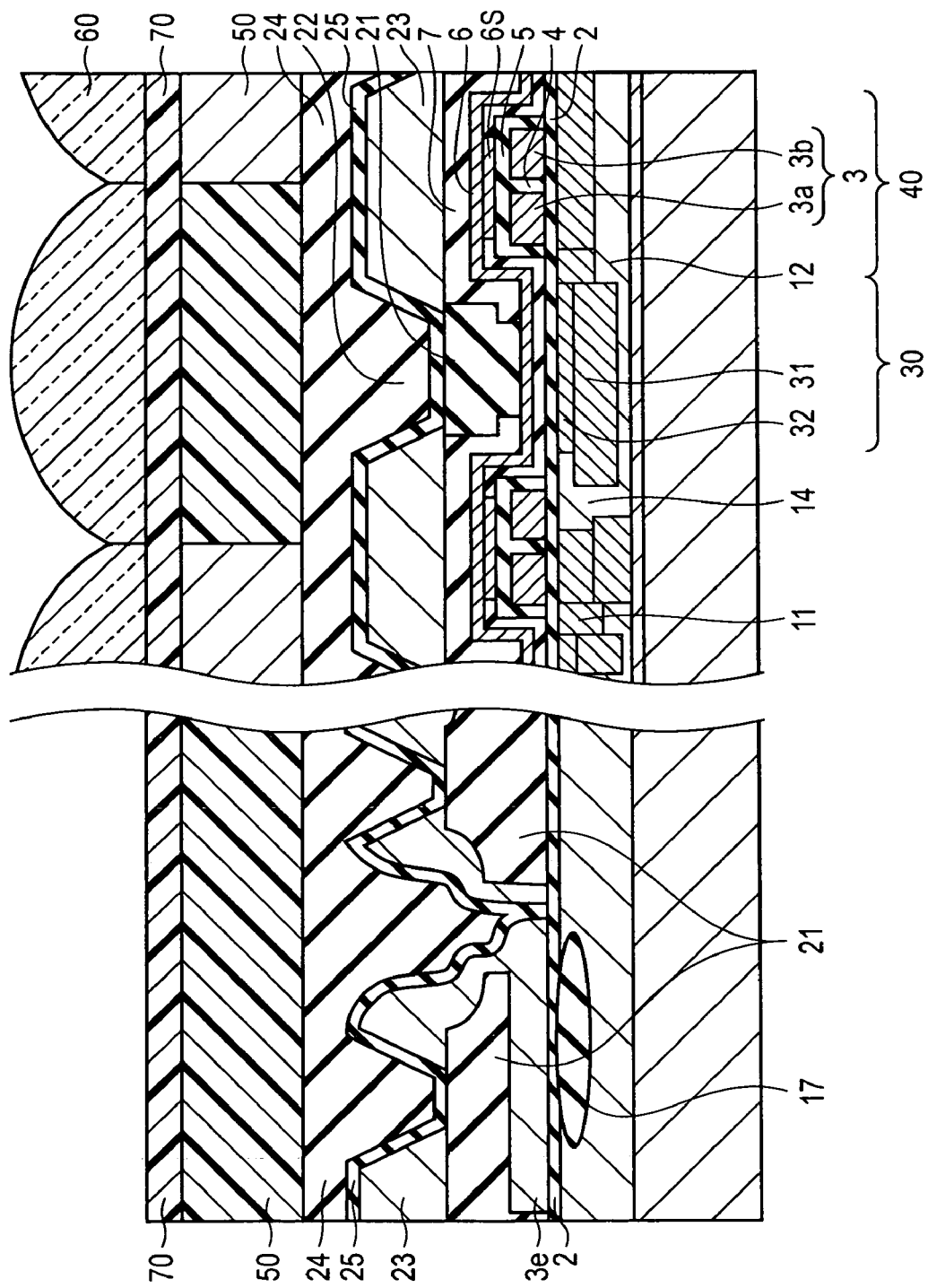
FIG. 5 is a section view of a main portion of a solid-state image pickup element of Embodiment 2 of the invention.

As described in Embodiment 1 above, the embodiment characterized in that the reflective material film 23 is formed in the same step as a wiring layer 23e which is made of an aluminum layer in a peripheral circuit section as shown in FIG. 5.

The embodiment is generally identical with Embodiment 1. In the embodiment, however, a charge transferring portion and a photodiode are formed in the substrate. The left side of the break line shows the peripheral circuit section, and the right side shows the imaging section.

The reflective material film 7 which is configured by a tungsten film, and in which an opening is formed in a region corresponding to the photodiode 30 is disposed above the imaging section of the solid-state image pickup element. On the film, the reflective material film 23 which is configured by an aluminum layer, and in which an opening is formed correspondingly with the photodiode 30 is formed over the whole surface of the imaging section via the planarizing layer 21 formed by a BPSG film. The hole portion is covered by the planarizing layer 24 which is made of an organic resin film constituting the waveguide 22. The reference numeral 25 denotes a cover film made of a silicon nitride film which is formed by the plasma CVD method. On the film, the color filter 50, the planarizing layer 70, and the microlens 60 are sequentially stacked.

Namely, as shown in FIG. 5, the solid-state image pickup element has a charge transfer electrode having a single-layer electrode structure. The electrode is formed in two separate steps, and hence the separately formed electrode portions are referred to as a first layer electrode and a second layer electrode, respectively. In the solid-state image pickup element, the charge transfer electrode 3 of the charge transferring portion formed in the silicon substrate 1 is configured by the first layer electrode 3a and the second layer electrode $3b$, and the gate oxide film 2 is configured by a stacked structure (ONO) film including: a bottom oxide film made of a silicon oxide (SiO) film which is formed on the surface of the semiconductor substrate; a silicon nitride (SiN) film formed on the bottom oxide film; and a top oxide film made of a silicon oxide (SiO) film which is formed on the silicon nitride film.

Although a plan view is omitted, the solid-state image pickup element chip comprises the imaging region configured by photodiodes and a charge transferring portion, and a peripheral circuit section such as an amplifier which is formed in the periphery of the region, on the semiconductor substrate. In a peripheral edge portion, pad portions are configured as external connecting terminals. As shown in FIG. 5, plural photodiodes 30 are formed in p-wells 12 which are separated from one another by an element separating region 11, and the charge transferring portions 40 which transfer charges detected from the photodiodes are formed in a meandering form between the photodiodes 30 (a plan view of the main portion is identical with that of Embodiment 1, see FIG. 2). Although not shown in FIG. 2, charge transfer channels 14 through which signal charges transferred by the charge transferring portions 40 are moved are formed similarly in a meandering form in a direction crossing the direction along which the charge transferring portions 40 elongate. On the other hand, in the peripheral circuit section, the element separation is performed by an element separating film 17 formed by LOCOS method.

A heavily doped p-type semiconductor layer is formed below the p-wells 12, so that charges are drained by application of a voltage. The first layer electrode $3a$ and the second layer electrode $3b$ which are arranged with interposing therebetween an inter-electrode insulating film 4 made of a silicon oxide film and an HTO film are formed via the gate oxide film 2 on the surface of each of the charge transferring portions 40. The photodiode 30 is formed by an n-type impurity region 31 which cooperates with the p-well 12 to form a pn junction, and a heavily doped p-type impurity region which is formed on the surface of the n-type impurity region 31, and which functions as a surface potential adjusting layer 32.

The antireflection film 6 made of a silicon nitride film having a thickness of 30 nm is formed on the first layer electrode $3a$ and the second layer electrode $3b$ via a silicon oxide film 5. On the film, a thin tungsten film which functions as the blocking layer 7, which has an opening in a light receiving region of the photodiode 30, and which has a thickness of 200 nm is formed via a titan nitride layer (not shown) which is formed by the sputtering method, and which has a thickness of 50 nm. The tungsten film is covered by a silicon nitride film functioning as the antireflection film 6, and the planarizing layer 21 formed by a BPSG film. The optical waveguide in the upper layer is as described above.

Next, a method of producing the solid-state image pickup element will be described.

First, a photodiode region and the charge transferring portion comprising the charge transfer electrode having a single-layer electrode structure are formed in the usual method. Namely, a silicon oxide film having a thickness of 25 nm, a silicon nitride film having a thickness of 50 nm, and a silicon oxide film having a thickness of 10 nm are formed on the surface of the n-type silicon substrate 1 having an impurity concentration of about $1.0 \times 10^{16}$ $cm^{-3}$, thereby forming the gate oxide film 2 of a three-layer structure.

On the gate oxide film 2, then, a first-layer doped amorphous silicon film doped by phosphorus and having a thickness of 0.25 μm is formed by the low-pressure CVD using $PH_3$, $N_2$, and $SiH_4$. At this time, the temperature of the substrate is set to 500 to 600° C.

Thereafter, the first-layer doped amorphous silicon film is patterned by the photolithography technique to form the first layer electrode. The silicon oxide film 4 having a thickness of 80 to 90 nm is formed by thermally oxidizing the surface of the first layer electrode. In the patterning process, reactive ion etching using a mixed gas of HBr and $O_2$ is performed to form the first layer electrode $3a$ and wiring $3e$ of the peripheral circuit. In the process, an etching apparatus of the ECR (Electron Cycrotoron Resonance) method or the ICP (Inductively Coupled Plasma) method is preferably used.

On the film, in a similar manner, a second-layer doped amorphous silicon film doped by phosphorus and having a thickness of 0.6 μm is formed by the low-pressure CVD using $PH_3$, $N_2$, and $SiH_4$, and planarized by the CMP (Chemical Mechanical Polishing) method, thereby forming the second layer electrode $3b$ so that the first and second layer electrode are juxtaposed on the silicon oxide film 2. The silicon oxide film 5 having a thickness of 80 to 90 nm is formed on the electrodes after thermal oxidization. At this time, preferably, the first-layer doped amorphous silicon film is covered by a silicon nitride film to prevent the film from being excessively oxidized.

Then, the silicon nitride film on the photodiode is removed away, and thereafter an HTO thin film of 10 nm is formed thereon by the low-pressure CVD method. The antireflection film 6 made of a silicon nitride film having a thickness of 30 nm is formed by the CVD method, and then patterned.

Thereafter, a silicon oxide film 6S is formed on the antireflection film by the CVD method, a titan nitride layer functioning as an adhesion layer (not shown), and a tungsten film functioning as the light blocking layer 7 are formed.

Figure 6A:
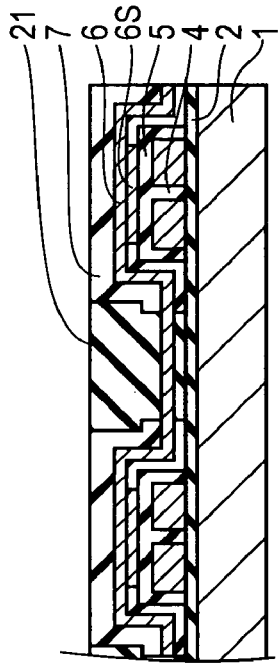
FIGS. 6A to 6C are section views showing steps showing producing the solid-state image pickup element of Embodiment 2 of the invention.

As shown in FIG. 6A, thereafter, the BPSG film 21 having a thickness of 300 nm is formed by the atmospheric pressure CVD method, and heated to 800 to 850° C. by furnace annealing. The surface is planarized by the CMP or resist etch-back.

Figure 6B:
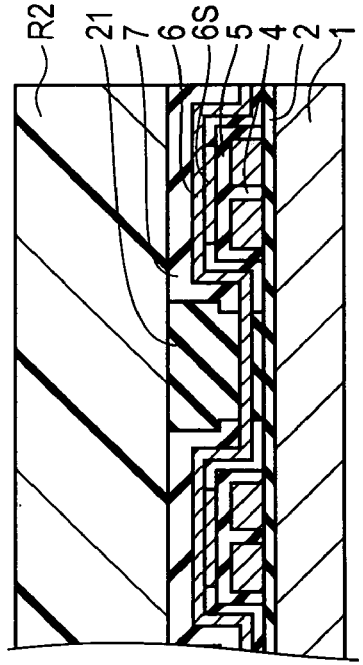
Figure 6C:
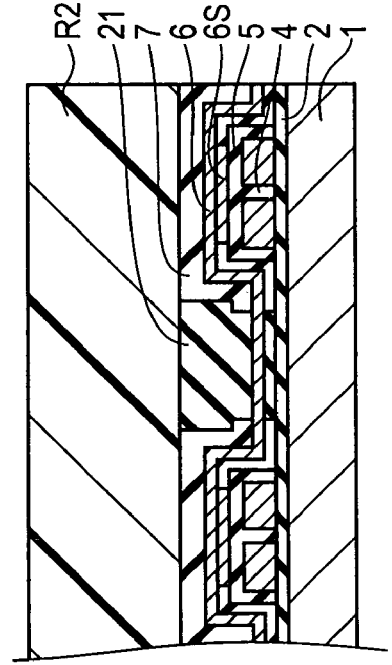
Figure 7A:
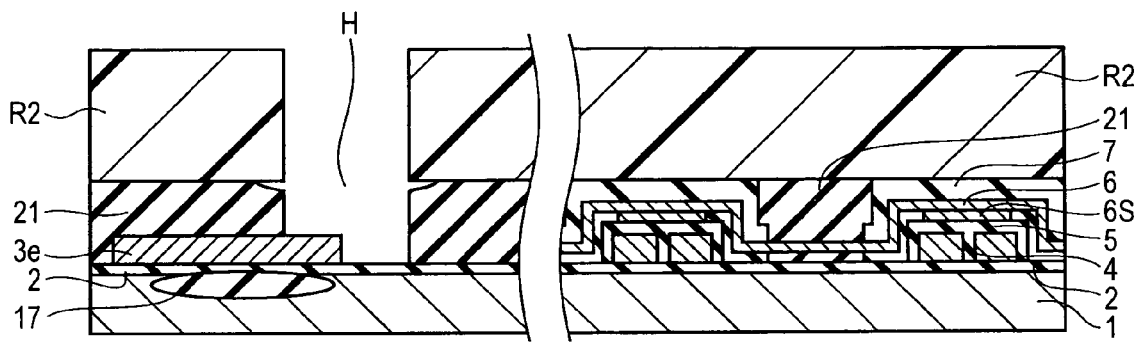
FIGS. 7A to 7C are section views showing steps of producing the solid-state image pickup element illustrating Embodiment 2 of the invention.

As shown in FIG. 6B, a resist pattern R2 which is opened in a contact forming region in the peripheral circuit section is then formed by the photolithography technique. In the etching, as shown FIG. 6C, the BPSG film is etched by isotropic etching so as to form a round shape. As shown in FIG. 7A, then, a contact hole H which has a perpendicular section is formed by anisotropic etching.

Figure 7B:
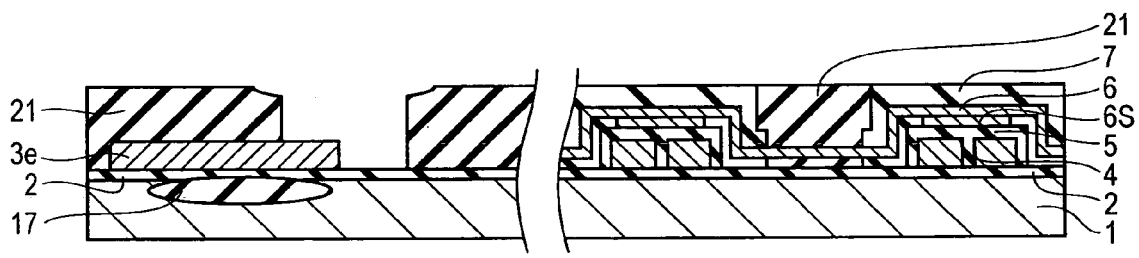

As shown in FIG. 7B, the resist pattern R2 is peeled and removed away by ashing using oxygen plasma.

Figure 7C:
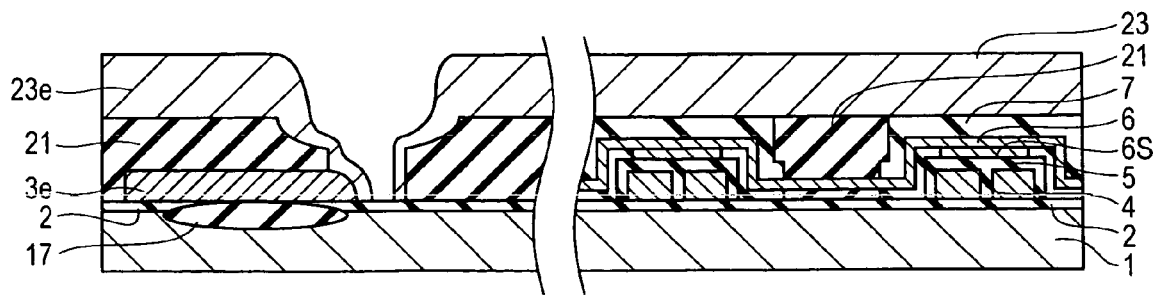

As shown in FIG. 7C, then, an aluminum layer is grown by the sputtering method, and thereafter the aluminum layer is patterned by the photolithography technique so that the contact hole is formed, the wiring $23e$ of the peripheral circuit section is formed, and, in the imaging section, the aluminum layer is formed as the reflective material film 23.

Figure 8A:
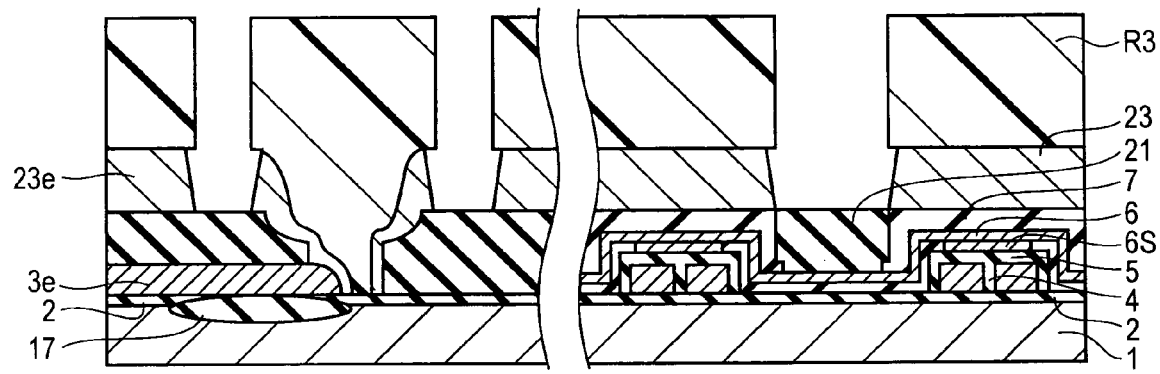
FIGS. 8A and 8B are section views showing steps of producing the solid-state image pickup element illustrating Embodiment 2 of the invention.
Figure 8B:
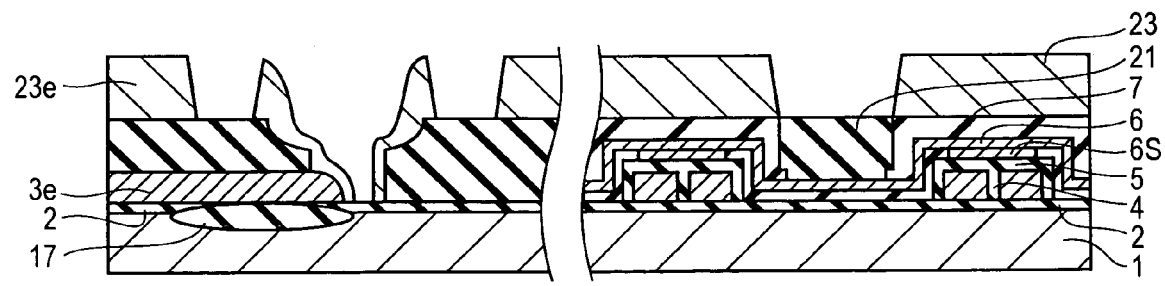

As shown in FIG. 8A, then, a resist pattern R3 is formed, and the aluminum layer is patterned with using the pattern as a mask to form the hole portion on the photodiode of the imaging section. At the same time, also the wiring $23e$ of the peripheral circuit section is patterned. Then, the resist pattern is removed away by ashing (FIG. 8B). In the patterning of the aluminum layer, the RIE is performed under conditions in which deposition is formed on the sidewall, thereby forming a tapered section.

Figure 9A:
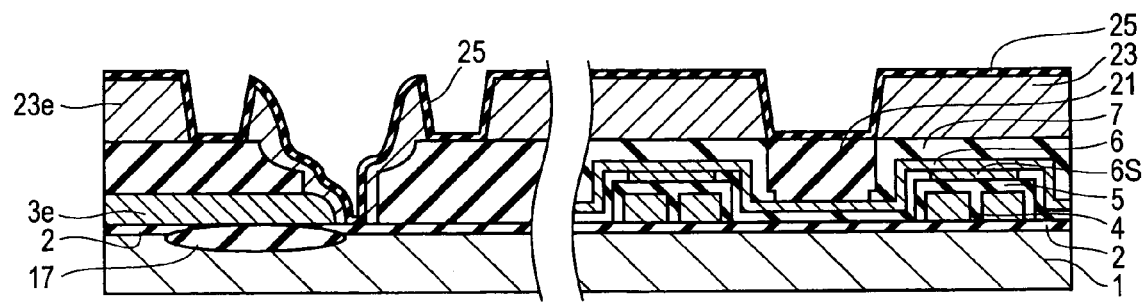
FIGS. 9A to 9C are section views showing steps of producing the solid-state image pickup element illustrating Embodiment 2 of the invention.
Figure 9B:
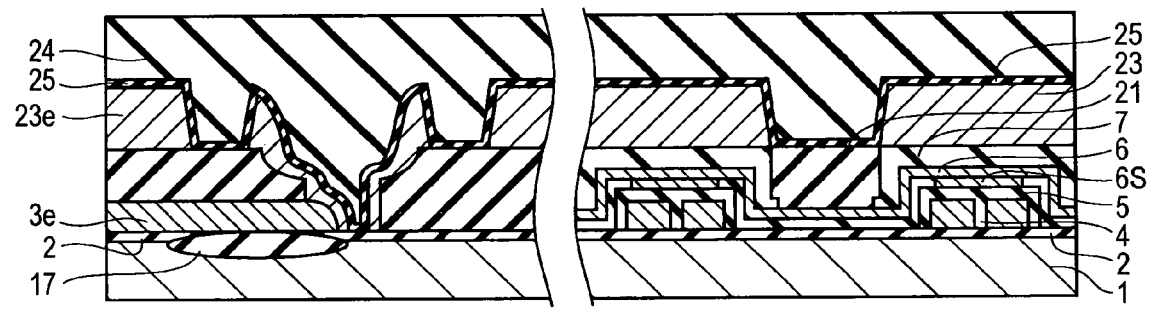

As shown in FIG. 9A, then, an aluminum cover film 25 made of a silicon nitride film is formed by the plasma CVD method. As shown in FIG. 9B, the planarizing layer 24 made of an organic film is grown, and planarized by etch-back or the CMP. The hole portion on the photodiode is filled with the planarizing layer. The layer in the hole portion serves as the optical waveguide 22. The silicon nitride film formed by the plasma CVD method may be omitted.

Figure 9C:
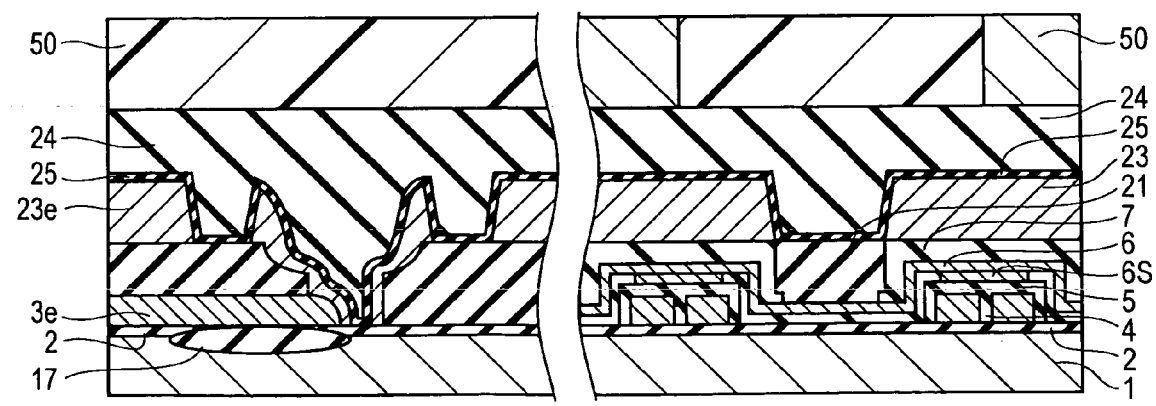
Figure 10:
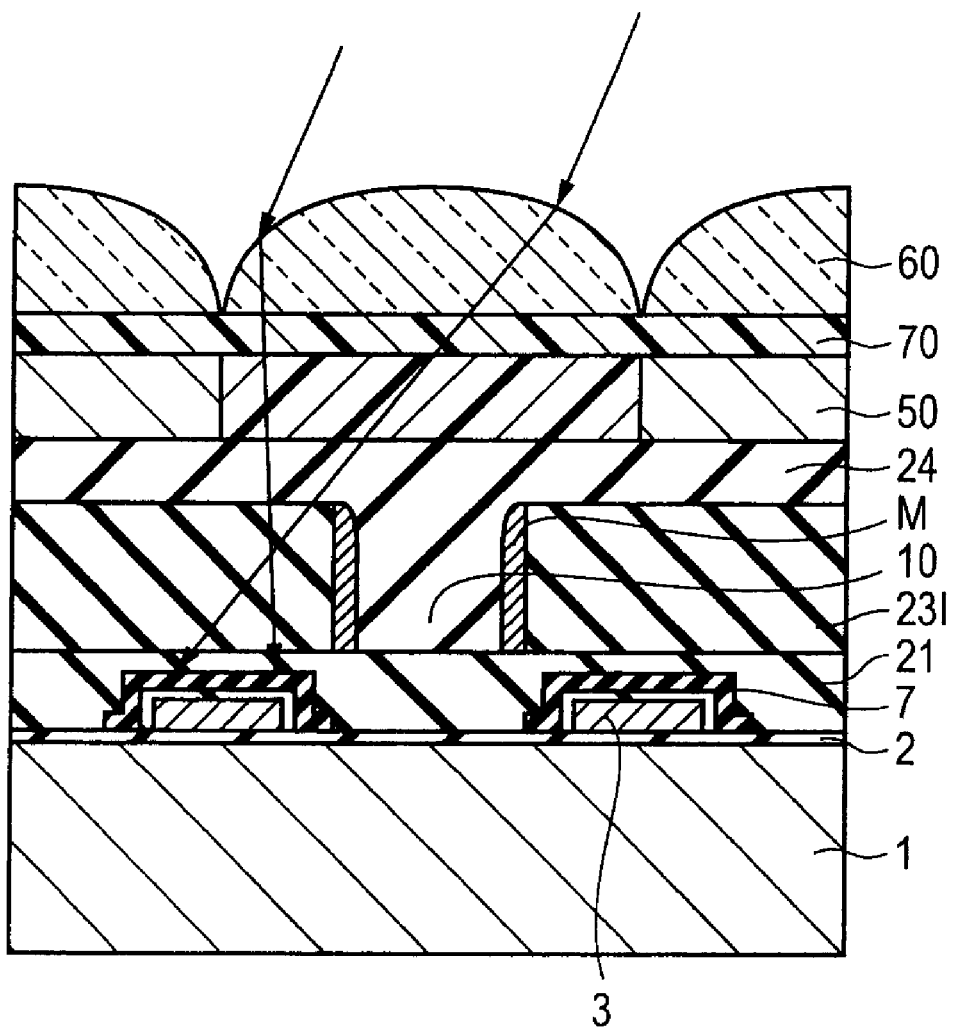
FIG. 10 is a section diagram of a solid-state image pickup element of the related-art example.
Figure 11:
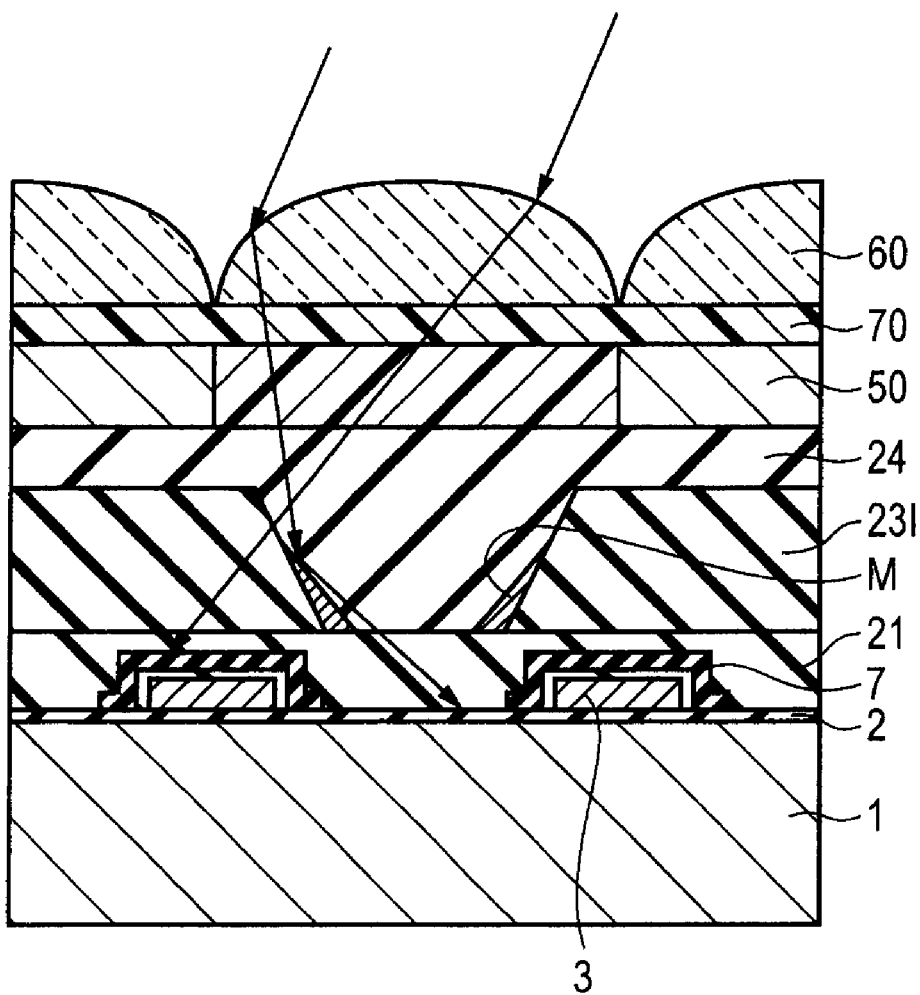
FIG. 11 is a section diagram of a solid-state image pickup element of another related-art example.

As shown in FIG. 9C, then, RGB color filters are sequentially formed, thereby forming the color filter layer 50. In the peripheral circuit section, one of the color filters is caused to remain as a planarizing layer 70S, so that the surface is planarized.

Then, an organic film is formed thereon to planarize the surface, and the planarizing layer 70 is formed. The microlens 60 is formed on the layer, thereby completing the solid-state image pickup element.

According to the method, the wall of the electrically conductive material film (reflective material) surrounding the optical waveguide, and the wiring portion are formed in the same step. Therefore, the surface is planarized, and the number of production steps can be reduced.

In this way, the solid-state image pickup element in which the whole chip surface is planarized can be formed without increasing the number of production steps. The series of production steps can be made more efficient, and the reduction of the production cost is facilitated.

In the embodiment, the wiring portion of the peripheral circuit section, and the reflective material portion are formed in the same step. Alternatively, the wiring portion of the peripheral circuit section may be formed after a step of forming the reflective material portion. According to the configuration, the degree of freedom of selection of the material is enhanced, and the wiring portion of the peripheral circuit is formed in a position near the uppermost layer. Even when a plasma process is used in a subsequent step, therefore, plasma charging due to the antenna effect can be reduced.

In the case where the reflective material portion is formed in another step, the reflective material portion may be configured by a light-blocking insulative material.

In the embodiment, the doped amorphous silicon film which is formed by annealing the doped amorphous silicon layer is used as the electrically conductive material for forming the electrode. Alternatively, a non-doped amorphous silicon layer is grown, and a doping process is performed after the growth.

In the above-mentioned embodiment, the charge transporting device (CCD) is used as the imaging section, however, the invention is applicable to an embodiment in which a CMOS element is used for the imaging section.

The invention is not restricted to the embodiments, and can be adequately implemented within the scope of the technical concept of the invention.

As described above, according to the invention, defocusing due to positional misalignment of a microlens can be reduced, and obliquely light can be efficiently converged and guided to a photodiode serving as the photoelectric converting portion. As a result, it is possible to form a solid-state image pickup element which is minute, and which has a high sensitivity.

The reflective material can be formed thick, and hence light can be surely converged.

Since the material of the optical waveguide is used also as the wiring material of the peripheral circuit section, the optical waveguide of the imaging section, and the wiring of the peripheral circuit section can be simultaneously formed, and the number of production steps can be reduced.

The level of the imaging section can be made coincident with that of the wiring of the peripheral circuit section. Therefore, shading due to thickness unevenness of the transparent film in the imaging section and the peripheral circuit section can be improved.

Since the whole pixel area excluding the light receiving portion is covered by the reflective material, mixture of light from an adjacent pixel can be prevented from occurring, and color mixture can be suppressed.

As described above, in the solid-state image pickup element of the invention, even when miniaturization is performed, the light converging efficiency can be enhanced, the size can be reduced, and the production is facilitated. Therefore, the solid-state image pickup element is very useful as a small image pickup element which is used in a digital camera, a mobile telephone, or the like.

The entire disclosure of each and every foreign patent application from which the benefit of foreign priority has been claimed in the present application is incorporated herein by reference, as if fully set forth.

What is claimed is:

1. A solid-state image pickup element comprising:
   a semiconductor substrate;
   a photoelectric converting portion formed in the semiconductor substrate;
   a reflective material portion comprising a hole portion, wherein a depth of the hole portion is substantially equal to the thickness of said reflective material portion,
   wherein the hole portion is located on a surface, on an area in which the photoelectric converting portion is formed, of the semiconductor substrate, the reflective material portion being formed so as to cover a surface of the semiconductor substrate; and
   an optical waveguide that propagates incident light while confining the light, to guide the light to the photoelectric converting portion,
   wherein the optical waveguide is configured by a transparent film formed in the hole portion, the transparent film having a light guiding function.

2. A solid-state image pickup element according to claim 1,
   wherein the hole portion configures a tapered face opened toward an upper portion of the semiconductor substrate.

3. A solid-state image pickup element according to claim 1,
   wherein the reflective material portion is configured by an electrically conductive material, and
   the solid-state image pickup element further comprises a wiring portion in a peripheral circuit section, the wiring portion being configured by the electrically conductive material.

4. A solid-state image pickup element according to claim 3,
   wherein the electrically conductive material is a material comprising at least one of aluminum, silver, gold and tungsten.

5. A solid-state image pickup element according to claim 3,
   wherein in the peripheral circuit section, the transparent film of the optical waveguide configures a passivation film that covers the wiring portion.

6. A solid-state image pickup element according to claim 1,
   wherein a peripheral circuit section comprises a wiring portion formed at a level which is higher than the reflective material portion.

7. A solid-state image pickup element according to claim 3, further comprising a planarizing layer covering the reflective material portion, the planarizing layer configuring a passivation film for the wiring portion of the electrically conductive material.

8. A solid-state image pickup element according to claim 1,
wherein the reflective material portion of an insulative material configures a passivation film covering a wiring portion in a peripheral circuit section.

9. A solid-state image pickup element according to claim 1,
wherein the transparent film is a stacked film of: a silicon nitride film; and a silicon oxide film or an organic film.

10. A method of producing a solid-state image pickup element which comprises: a semiconductor substrate; a photoelectric converting portion formed in the semiconductor substrate; and an optical waveguide that propagates incident light while confining the light, to guide the light to the photoelectric converting portion, the method comprising:
a step of forming the optical waveguide including:
forming a reflective material film so as to cover a surface of the semiconductor substrate in which the imaging section is formed;
forming, in the reflective material film, a hole portion in a region corresponding to the photoelectric converting portion, so that a depth of the hole portion is substantially equal to the thickness of said reflective material film; and
forming a transparent film in the hole portion, the transparent film having a predetermined refractive index to have a light guiding function.

11. A method of producing a solid-state image pickup element according to claim 10,
wherein the step of forming the hole portion is a step in which etching is performed on the reflective material film while controlling etching conditions so as to form a predetermined tapered face.

12. A method of producing a solid-state image pickup element according to claim 10,
wherein the step of forming the optical waveguide includes:
forming an electrically conductive material film over a whole surface of the semiconductor substrate; and
patterning the electrically conductive material so as to form, in the imaging section, the hole portion corresponding to the photoelectric converting portion and so as to form, in a peripheral circuit section, a wiring portion.

13. A method of producing a solid-state image pickup element according to claim 10,
wherein the reflective material film is an electrically conductive material containing at least one of aluminum, silver, gold and tungsten.

14. A method of producing a solid-state image pickup element according to claim 12, further comprising
a step of, after the step of patterning the electrically conductive material film, forming the transparent film so as to cover the hole portion and the wiring portion of the peripheral circuit section,
wherein, in the imaging section, the transparent film configures the optical waveguide, and, in the peripheral circuit section, configures a passivation film which covers the wiring portion.

15. A method of producing a solid-state image pickup element according to claim 10, further comprising
a step of forming a wiring portion in a peripheral circuit section after the step of forming the reflective material portion.

16. A method of producing a solid-state image pickup element according to claim 12, further comprising
a step of forming a planarizing layer covering the reflective material portion, simultaneously with forming a passivation film covering the wiring portion of the electrically conductive material.

17. A method of producing a solid-state image pickup element according to claim 10,
wherein the step of forming the reflective material film comprises
a step of forming a film of an insulative material over a whole surface of the semiconductor substrate, which is a step of configuring a passivation film which covers a wiring portion in a peripheral circuit section.

18. A method of producing a solid-state image pickup element according to claim 10,
wherein the step of forming the transparent film comprises a step of forming a silicon nitride film by a plasma CVD method.

19. A method of producing a solid-state image pickup element according to claim 10, further comprising
a step of forming a color filter and a microlens on the transparent film.

* * * * *